(12) United States Patent
Inada

(10) Patent No.: US 8,269,867 B2
(45) Date of Patent: Sep. 18, 2012

(54) SOLID-STATE IMAGE PICKUP DEVICE, DRIVING CONTROL METHOD, AND IMAGE PICKUP APPARATUS

(75) Inventor: Yoshiaki Inada, Tokyo (JP)

(73) Assignee: Sony Corporation, Tokyo (JP)

( * ) Notice: Subject to any disclaimer, the term of this patent is extended or adjusted under 35 U.S.C. 154(b) by 607 days.

(21) Appl. No.: 12/516,079

(22) PCT Filed: Sep. 26, 2008

(86) PCT No.: PCT/JP2008/067381
§ 371 (c)(1),
(2), (4) Date: May 22, 2009

(87) PCT Pub. No.: WO2009/041552
PCT Pub. Date: Apr. 2, 2009

(65) Prior Publication Data
US 2010/0020211 A1    Jan. 28, 2010

(30) Foreign Application Priority Data

Sep. 28, 2007  (JP) ................................. 2007-254993

(51) Int. Cl.
*H04N 3/14* (2006.01)
*H04N 5/335* (2011.01)
*H04N 5/217* (2011.01)

(52) U.S. Cl. ....................................... 348/294; 348/241
(58) Field of Classification Search .................. 348/294, 348/241, 302, 308–310; 250/208.1
See application file for complete search history.

(56) References Cited

U.S. PATENT DOCUMENTS

| | | | |
|---|---|---|---|
| 4,521,763 A | 6/1985 | Murao et al. | |
| 5,169,234 A | 12/1992 | Bohm | |
| 6,346,907 B1 | 2/2002 | Dacy et al. | |
| 2005/0195304 A1 | 9/2005 | Nitta et al. | |
| 2007/0024731 A1* | 2/2007 | Muramatsu et al. | 348/308 |

FOREIGN PATENT DOCUMENTS

| | | |
|---|---|---|
| EP | 1 058 234 A1 | 12/2000 |
| EP | 1 655 840 A1 | 5/2005 |
| JP | 2005-278135 | 10/2005 |
| JP | 2005-323331 | 11/2005 |
| JP | 2006-033452 | 2/2006 |
| JP | 2006-128752 | 5/2006 |

OTHER PUBLICATIONS

International Search Report dated Dec. 18, 2008.

* cited by examiner

*Primary Examiner* — Alicia M Harrington
(74) *Attorney, Agent, or Firm* — SNR Denton US LLP

(57) ABSTRACT

A solid-state image pickup device, a driving control method, and an image pickup apparatus are capable of, in the case of changing the resolution of AD conversion, changing only a pulse that needs to be changed. In a case where the mode of the resolution of AD conversion is in a first mode, such as a 9-bit mode, a decoder operates a first counter. In a case where the mode of the resolution of AD conversion is another mode, such as a 10-bit mode or a 12-bit mode, the decoder stops a counting operation by the first counter and starts counting by second counter when the count value of the first counter reaches a start count value stored in a register, and resumes counting by the first counter when the count value of the second counter reaches the number of counts stored in the register.

3 Claims, 9 Drawing Sheets

| | H COUNT VALUES | | THE NUMBER OF COUNTS |
|---|---|---|---|
| | FOR DOWN-COUNTING | FOR UP-COUNTING | |
| 10-BIT MODE | 756 | 1556 | 512 |
| 12-BIT MODE | 756 | 1556 | 3584 |

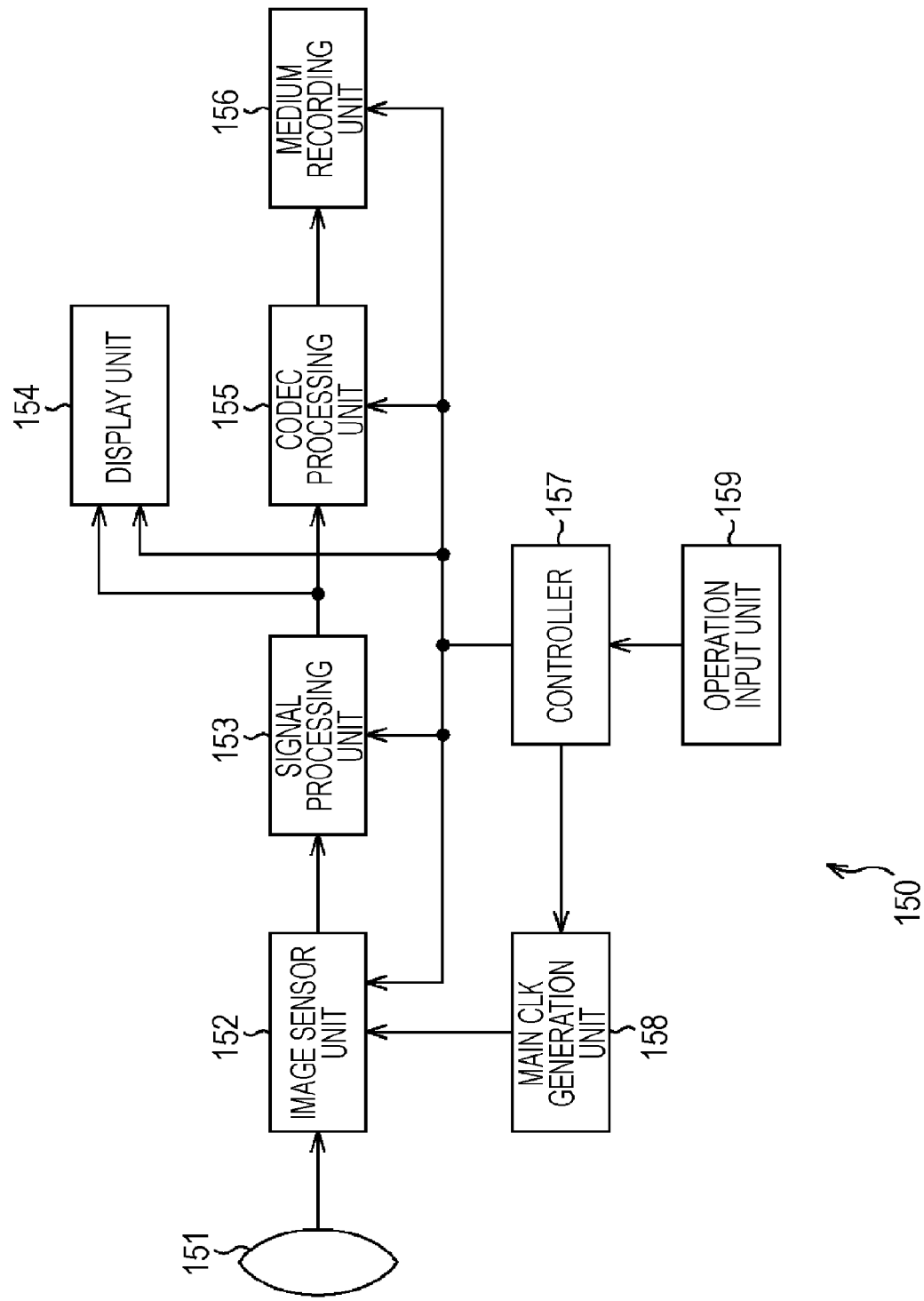

SOLID-STATE IMAGE PICKUP DEVICE, DRIVING CONTROL METHOD, AND IMAGE PICKUP APPARATUS

TECHNICAL FIELD

The present invention relates to a solid-state image pickup device, a driving control method, and an image pickup apparatus, and particularly, to a solid-state image pickup device, a driving control method, and an image pickup apparatus that are capable of performing, in the case of changing the resolution of AD conversion, changing of only a pulse that needs to be changed, with a more simplified configuration.

BACKGROUND ART

As solid-state image pickup devices, CMOS (Complementary Metal Oxide Semiconductor) image sensors based on a column-parallel AD conversion method (hereinafter, referred to as a column AD conversion method) in which pixels are two-dimensionally arranged in a matrix and AD converters (ADCs (Analog-Digital Converters) are arranged for individual columns, have been proposed.

In addition, in recent years, CMOS image sensors based on a column AD conversion method that have been improved to be more suitable for high-speed image capturing, have also been proposed. For example, in Patent Document 1, a CMOS image sensor based on a column AD conversion method is proposed in which, by using an up/down counter, a higher frame rate and a higher resolution can be attained without increasing the circuit scale.

Incidentally, recent digital still cameras (image pickup apparatuses) have generally been provided with a static image mode in which static images are captured and a moving image mode in which moving images are captured. In addition, CMOS image sensors based on a column AD conversion method often perform processing while switching the resolution of AD conversion in accordance with the mode in such a manner that a resolution of 12 bits is set for a static image mode, a resolution of 10 bits is set for a moving image mode, and a resolution of 9 bits is set for a high-speed moving image mode.

Now, the resolution of AD conversion includes a "time resolution" on the horizontal axis and a "voltage or current resolution" on the vertical axis in the case that the horizontal axis represents time and the vertical axis represents a voltage value or a current value. In this description, the resolution of AD conversion, or simply resolution, means a "time resolution". Provided that a CMOS image sensor operates in accordance with a minimum H clock with which the CMOS image sensor can be driven, increasing the resolution of AD conversion means increasing the period of time (the number of counts of H clocks) necessary for AD conversion, and the voltage value or the current value per count, that is, the resolution on the vertical axis, increases in accordance with the AD conversion time period.

Thus, a CMOS image sensor based on a column AD conversion method needs to increase or decrease a comparison time period during which a pixel signal output from a pixel and a reference voltage are compared with each other, in the case of switching the resolution of AD conversion in accordance with a change in the mode. Since a system control device (hereinafter, referred to as an SCU (Signal Control Unit) of the CMOS image sensor controls a pulse timing for controlling the comparison time period, an increase or decrease in the comparison time period can be realized. Specifically, the SCU increases or decreases the comparison time period by changing, in accordance with each mode, a register which determines the length of a pulse for controlling the comparison time period.

Conventionally, as control for changing a register which determines the length of a pulse for controlling the comparison time period, either method 1) in which registers for all the pulse timings are uniformly changed in accordance with the resolution or method 2) in which a register that needs to be changed is selectively changed in accordance with the resolution, has been employed.

For example, a case where the resolution is changed from 10 bits to 12 bits will be explained by way of example. Method 1) for uniformly changing registers is a method for changing registers for all the pulse timings to have a value that is four times the current value at which setting for 10 bits is performed, and has the advantage in that registers do not have to be provided for individual resolutions.

Patent Document 1: Japanese Unexamined Patent Application Publication No. 2005-278135

DISCLOSURE OF INVENTION

Technical Problem

However, in method 1), the interval between a P phase (Reset Phase) period during which a reset component, which is a variation component of individual pixels, is measured and a D phase (Data Phase) period during which a data component is measured in a CDS (Correlated Double Sampling) process is also needlessly extended. Consequently, a CDS processing time period is extended. When the CDS processing time period is extended, the bandwidth of an HPF (High Pass Filter) is substantially widened, as shown in FIG. 1. Thus, there is a problem in that contamination of white noise such as thermal noise occurs at the time of AD conversion, the bandwidth of noise passing through the HPF after the AD conversion increases, and the S/N deteriorates.

In addition, method 1) has another problem in that since registers are uniformly changed, other pulses, which were not originally desired to be extended, such as, for example, a reset pulse, a read pulse, an address pulse, a shutter pulse, a ramp signal control pulse, and an inside-column control pulse, also move in an associated manner.

Meanwhile, method 2) has a problem in that since it is necessary to perform calculation of all the related registers every time the resolution changes, the number of gates in the SCU increases and the circuit scale thus increases.

The present invention has been made in view of such circumstances. The present invention is capable of performing, in the case of changing the resolution of AD conversion, changing of only a pulse that needs to be changed, with a more simplified configuration.

Technical Solution

A solid-state image pickup device according to a first aspect of the present invention for performing switching between a plurality of AD conversion resolutions by changing a comparison time period during which a pixel signal output from a pixel and a reference voltage are compared with each other, includes a first counter used for counting the comparison time period; a second counter that counts a time period during which the first counter stops counting; storage means for storing a number of counts representing a difference between a comparison time period for a first resolution that is the lowest resolution among the plurality of AD conversion resolutions and a comparison time period for a second resolution that is different from the first resolution, and a start count value that is a count value of the first counter at which counting to the number of counts is started; and counter control means for stopping counting by the first counter and starting counting by the second counter when a set AD conversion resolution is the second resolution and the count value of the first counter reaches the start count value and for resuming counting by the first counter when the count value of the second counter reaches the number of counts.

A driving control method according to the first aspect of the present invention for a solid-state image pickup device including a first counter used for counting a comparison time period during which a pixel signal output from a pixel and a reference voltage are compared with each other, a second counter that counts a time period during which the first counter stops counting, and storage means for storing a number of counts representing a difference between a comparison time period for a first resolution that is the lowest resolution among a plurality of AD conversion resolutions and a comparison time period for a second resolution that is different from the first resolution, and a start count value that is a count value of the first counter at which counting to the number of counts is started, the solid-state image pickup device performing switching between the plurality of AD conversion resolutions by changing the comparison time period, includes the step of stopping counting by the first counter and starting counting by the second counter when a set AD conversion resolution is the second resolution and the count value of the first counter reaches the start count value, and resuming counting by the first counter when the count value of the second counter reaches the number of counts.

In the first aspect of the present invention, counting by the first counter is stopped and counting by the second counter is started when a set AD conversion resolution is the second resolution, which is different from the first resolution, and the count value of the first counter reaches the start count value stored in the storage means, and counting by the first counter is resumed when the count value of the second counter reaches the number of counts stored in the storage means.

An image pickup apparatus according to a second aspect of the present invention captures an image by using a solid-state image pickup device for performing switching between a plurality of AD conversion resolutions by changing a comparison time period during which a pixel signal output from a pixel and a reference voltage are compared with each other. The solid-state image pickup device includes a first counter used for counting the comparison time period, a second counter that counts a time period during which the first counter stops counting, storage means for storing a number of counts representing a difference between a comparison time period for a first resolution that is the lowest resolution among the plurality of AD conversion resolutions and a comparison time period for a second resolution that is different from the first resolution, and a start count value that is a count value of the first counter at which counting to the number of counts is started, and counter control means for stopping counting by the first counter and starting counting by the second counter when a set AD conversion resolution is the second resolution and the count value of the first counter reaches the start count value and for resuming counting by the first counter when the count value of the second counter reaches the number of counts.

In the second aspect of the present invention, in the solid-state image pickup device contained in the image pickup apparatus, counting by the first counter is stopped and counting by the second counter is started when a set AD conversion resolution is the second resolution, which is different from the first resolution, and the count value of the first counter reaches the start count value stored in the storage means, and counting by the first counter is resumed when the count value of the second counter reaches the number of counts stored in the storage means.

Advantageous Effects

According to the first and second aspects of the present invention, in the case of changing the resolution of AD conversion, changing of only a pulse that needs to be changed can be performed with a more simplified configuration.

BRIEF DESCRIPTION OF DRAWINGS

FIG. 10 is a block diagram showing a configuration example of an embodiment of a digital camera to which the present invention is applied.

Figure 1:
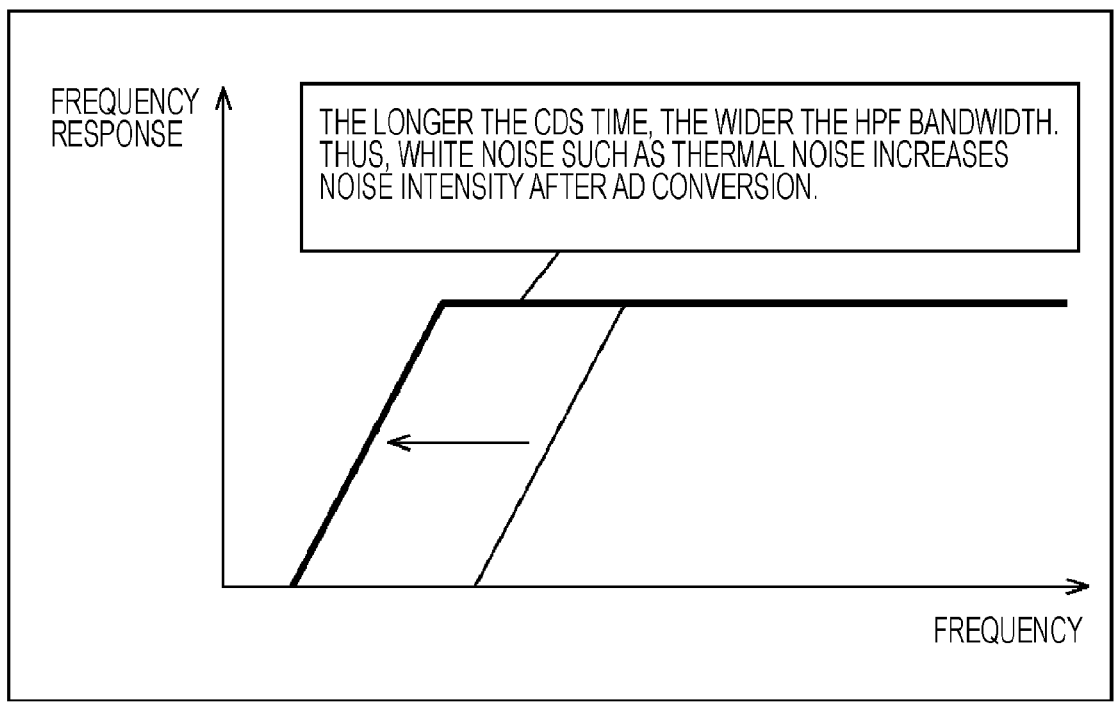
FIG. 1 is an illustration for explaining problems caused by conventional methods.

EXPLANATION OF REFERENCE NUMERALS 30 image sensor, 31 logic control circuit, 101 register, 102 decoder, 103 AND circuit, 104 H counter, 105 AND circuit 106 idle counter, 150 digital camera, 152 image sensor unit 152

BEST MODE FOR CARRYING OUT THE INVENTION

Hereinafter, embodiments of the present invention will be explained with reference to the drawings.

Figure 2:
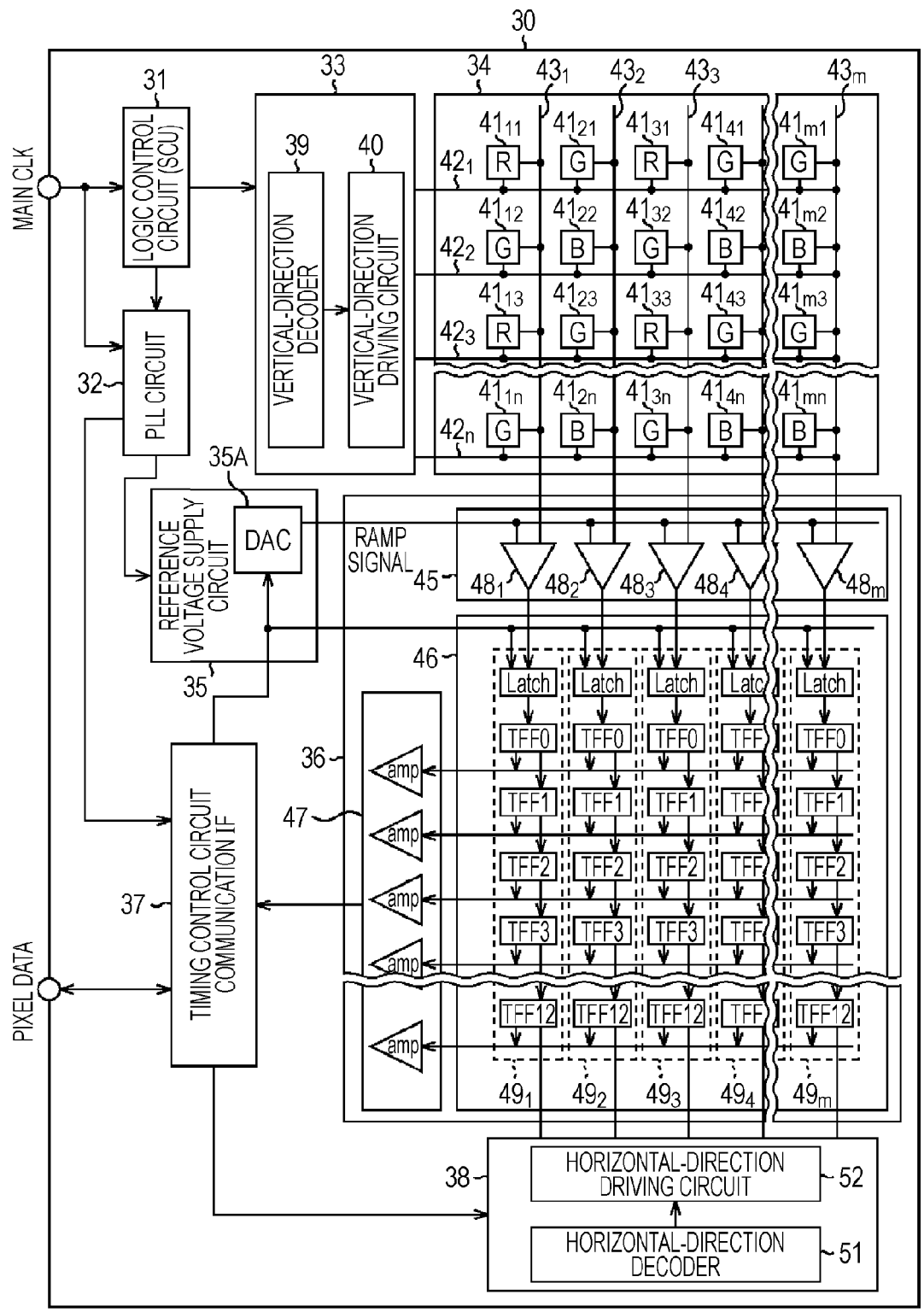
FIG. 2 is a block diagram showing a configuration example of an embodiment of a solid-state image pickup device to which the present invention is applied.

FIG. 2 shows a configuration example of an embodiment of a solid-state image pickup device (image sensor) to which the present invention is applied.

An image sensor 30 in FIG. 2 is an X-Y address-type solid-state image pickup device (CMOS image sensor) employing a column AD conversion method. The image sensor 30 is constituted by a logic control circuit (SCU) 31, a PLL (Phase Locked Loop) circuit 32, a vertical scanning circuit 33, a pixel array 34, a reference voltage supply circuit 35, a column ADC (Analog to Digital Converter) 36, a timing control circuit/communication IF (Interface) 37, and a horizontal scanning circuit 38.

The logic control circuit 31 controls each unit of the image sensor 30. The logic control circuit 31 supplies, to the PLL circuit 32, the vertical scanning circuit 33, and the like, various timing signals and control signals based on a main CLK (Clock) input to the image sensor 30.

For example, the logic control circuit 31 generates an H clock signal in accordance with the main CLK, and supplies the H clock signal to the vertical scanning circuit 33. The H clock signal is a clock signal for controlling a time period (one horizontal scanning time period) during which a pixel sequence arranged in one row of individual pixels 41 which are two-dimensionally arranged in a matrix in the pixel array 34 is scanned.

Under the control of the logic control circuit 31, the PLL circuit 32 divides the frequency of the input main CLK with a specific frequency division ratio, and supplies a frequency-divided timing signal to the reference voltage supply circuit 35 and the timing control circuit/communication IF 37, and the like.

The vertical scanning circuit 33 is provided with a vertical-direction decoder 39 and a vertical-direction driving circuit 40. In accordance with timing signals from the logic control circuit 31, the vertical scanning circuit 33 sequentially controls the pixels 41 arranged in the vertical direction of the pixel array 34 at specific timings and causes the pixels 41 to output pixel signals.

The vertical-direction decoder 39 performs, for example, control of the vertical-direction driving circuit 40 for selecting a row on which pixel signals are output, when decimation of pixels 41 on a specific row among the individual pixels 41 in the pixel array 34 is performed and pixels 41 on the other rows output pixel signals.

The vertical-direction driving circuit 40 supplies, to each of the pixels 41 in the pixel array 34, control signals for driving the pixels 41 in the pixel array 34, that is, a selecting signal for turning on and off a selecting transistor, a reset signal for turning on and off a reset transistor, a transfer signal for turning on and off a transfer transistor, and the like, which will be described later.

The pixel array 34 is constituted by pixels $41_{11}$ to $41_{mn}$, the number of horizontal and vertical pixels being m×n, n row control lines $42_1$ to $42_n$, and m vertical signal lines $43_1$ to $43_m$. The pixels $41_{11}$ to $41_{mn}$ are connected through the row control lines $42_1$ to $42_n$ to the vertical scanning circuit 33, and are connected through the vertical signal lines $43_1$ to $43_m$ to the column ADC 36. Note that in this description, in a case where individual rows and individual columns in the pixel array 34 do not need to be distinguished from each other, an explanation will be provided in which subscript numerals are omitted.

The pixels $41_{11}$ to $41_{mn}$ are arranged, for example, in accordance with a Bayer pattern, in such a manner that light in three colors (R (RED), G (GREEN), and B (BLUE)) is received. The pixels $41_{11}$ to $41_{mn}$ output pixel signals to the vertical signal lines $43_1$ to $43_m$ in accordance with control signals supplied from the vertical scanning circuit 33 through the row control lines $42_1$ to $42_n$.

Although not illustrated, the pixels 41 having a three-transistor configuration including a photoelectric conversion element (for example, a photodiode), a transfer transistor for transferring an electric charge obtained at the photoelectric conversion element to an FD (floating diffusion) unit, a reset transistor for resetting the potential of the FD unit, and an amplifying transistor for outputting a pixel signal corresponding to the potential of the FD unit, a four-transistor configuration further including a selecting transistor for performing pixel selection, or the like may be used.

The reference voltage supply circuit 35 includes a DAC (Digital to Analog Converter) 35A. The reference voltage supply circuit 35 supplies, to the column ADC 36, a ramp signal, which is a so-called ramp waveform signal, whose level changes in a ramp form in accordance with the lapse of time.

The column ADC 36 is constituted by a voltage comparison unit 45, an A/D conversion unit 46, and a sensitivity amplification unit 47.

The voltage comparison unit 45 includes m comparators $48_1$ to $48_m$. Pixel signals are supplied from the pixels $41_{11}$ to $41_{mn}$ through the vertical signal lines $43_1$ to $43_m$ to the comparators $48_1$ to $48_m$, respectively. In addition, a ramp signal is supplied from the reference voltage supply circuit 35 to the comparators $48_1$ to $48_m$.

The comparators $48_1$ to $48_m$ compare the pixel signals supplied through the vertical signal lines $43_1$ to $43_m$ with the ramp signal from the reference voltage supply circuit 35, and supplies comparison result signals, which represent the results of the comparison, to the A/D conversion unit 46.

That is, the comparator $48_1$ compares pixel signals sequentially supplied from the pixels $41_{11}$ to $41_{1n}$ on the first column through the vertical signal line $43_1$ with the ramp signal supplied from the reference voltage supply circuit 35, and supplies, to an A/D converter $49_1$ of the A/D conversion unit 46, comparison result signals obtained from the results of the comparison. As with the comparator $48_1$, the comparator $48_2$ supplies, to an A/D converter $49_2$ of the A/D conversion unit 46, comparison result signals obtained from the results of comparison between pixel signals supplied through the vertical scanning line $43_2$ and the ramp signal. Subsequently, in a similar manner, the comparator $48_m$ supplies, to an A/D converter $49_m$ of the A/D conversion unit 46, comparison result signals obtained from the results of comparison between pixel signals supplied through the vertical signal line $43_m$ and the ramp signal.

The A/D conversion unit 46 includes m A/D converters $49_1$ to $49_m$. Comparison result signals are supplied from the comparators $48_1$ to $48_m$ of the voltage comparison unit 45 to the A/D converters $49_1$ to $49_m$, respectively.

The A/D converters $49_1$ to $49_m$ are each constituted by a Latch and thirteen TFTs (Toggle Flip-Flops). The A/D converters $49_1$ to $49_m$ are each capable of outputting pixel data of up to 13 bits.

That is, comparison result signals are supplied from the comparators $48_1$ to $48_m$ to the A/D converters $49_1$ to $49_m$, and specific timing signals are supplied from the timing control circuit/communication IF 37 to the A/D converters $49_1$ to $49_m$. In addition, by counting the comparison result signals supplied from the comparators $48_1$ to $48_m$ in accordance with the timing signals from the timing control circuit/communication IF 37, the A/D converters $49_1$ to $49_m$ perform A/D conversion of analog pixel signals output from the pixels $41_{11}$ to $41_{mn}$ in the pixel array 34, and output pixel data obtained from the results.

The sensitivity amplification unit 47 includes thirteen amplifiers (amps). The sensitivity amplification unit 47 buffers signals output from the A/D conversion unit 46 and supplies the signals to the timing control circuit/communication IF 37.

The timing control circuit/communication IF 37 supplies, to the DAC 35A of the reference voltage supply circuit 35 and the horizontal scanning circuit 38, specific timing signals based on a timing signal from the PLL circuit 32. In addition, the timing control circuit/communication IF 37 outputs, to a signal processing circuit in the subsequent stage, digital pixel data supplied from the column ADC 36, in accordance with a specific method such as LVDS (Low Voltage Differential Signaling) or the like.

The horizontal scanning circuit 38 includes a horizontal-direction decoder 51 and a horizontal-direction driving circuit 52. The horizontal scanning circuit 38 sequentially selects the plurality of A/D converters $49_1$ to $49_m$ arranged in the horizontal direction of the column ADC 36 in accordance with timing signals from the timing control circuit/communication IF 37, and causes the A/D converters 49$_1$ to 49$_m$ to output pixel data. The horizontal-direction decoder 51 performs control of the horizontal-direction driving circuit 52 for selecting a column on which pixel data is output, when decimation of pixels 41 on a specific column is performed and pixels 41 on the other columns output pixel data. The horizontal-direction driving circuit 52 generates a control signal for driving a specific column.

The image sensor 30 configured as described above has three modes, a 9-bit mode in which pixel data is output at a resolution of 9 bits, a 10-bit mode in which pixel data is output at a resolution of 10 bits, and a 12-bit mode in which pixel data is output at a resolution of 12 bits. The image sensor 30 is capable of performing switching between the three modes in accordance with a control signal from the outside and outputting pixel data at a resolution of 9 bits, 10 bits, or 12 bits.

For example, in the case of a digital camera 150 (FIG. 10) in which the image sensor 30 in FIG. 2 is installed, each mode is set in an appropriate manner, in such a manner that, for example, the 12-bit mode is set in the case where static images are captured in accordance with full-pixel reading at 15 frames/second, the 10-bit mode is set in the case where moving images are captured at 60 frames/second, and the 9-bit mode is set in the case where light control is monitored.

Figure 3:
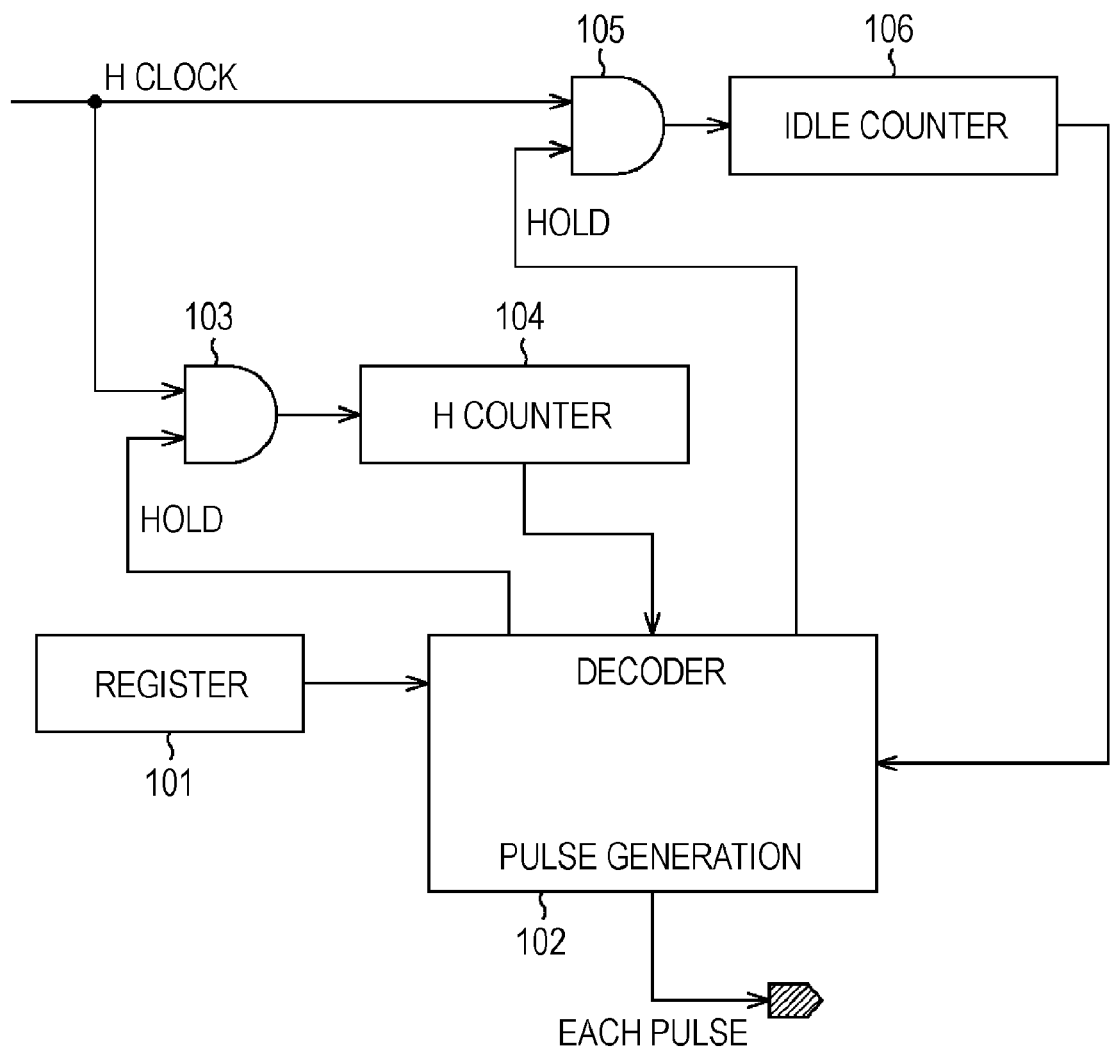
FIG. 3 is a block diagram showing an example of the functional configuration of a logic control circuit.

FIG. 3 shows an example of the functional configuration of the logic control circuit 31 relating to switching of the resolution of AD conversion.

The logic control circuit 31 is constituted by a register 101, a decoder 102, an AND circuit 103, an H counter 104, an AND circuit 105, and an idle counter 106.

The register 101 holds H count values (count values of the H counter 104) corresponding to a rising timing and a falling timing of each pulse output from the logic control circuit 31.

The decoder 102 monitors the count value of the H counter 104, generates various pulses in such a manner that rising and falling occur at H count values for rising and falling held in the register 101, and supplies the various pulses to the vertical scanning circuit 33 and other circuits.

Here, pulses output from the decoder 102 and relating to AD conversion include a reset pulse (RST) for controlling a reset transistor, a transfer pulse (TR) for controlling a transfer transistor, and a P-phase AD enable pulse for controlling a P phase (Reset Phase) period during which a reset component, which is a variation component of individual pixels, is measured and a D-phase AD enable pulse for controlling a D phase (Data Phase) period during which a data component is measured in a CDS process (Correlated Double Sampling), in each of the pixels 41. The details of the individual pulses will be described later with reference to FIG. 6.

Figures 4, 5:
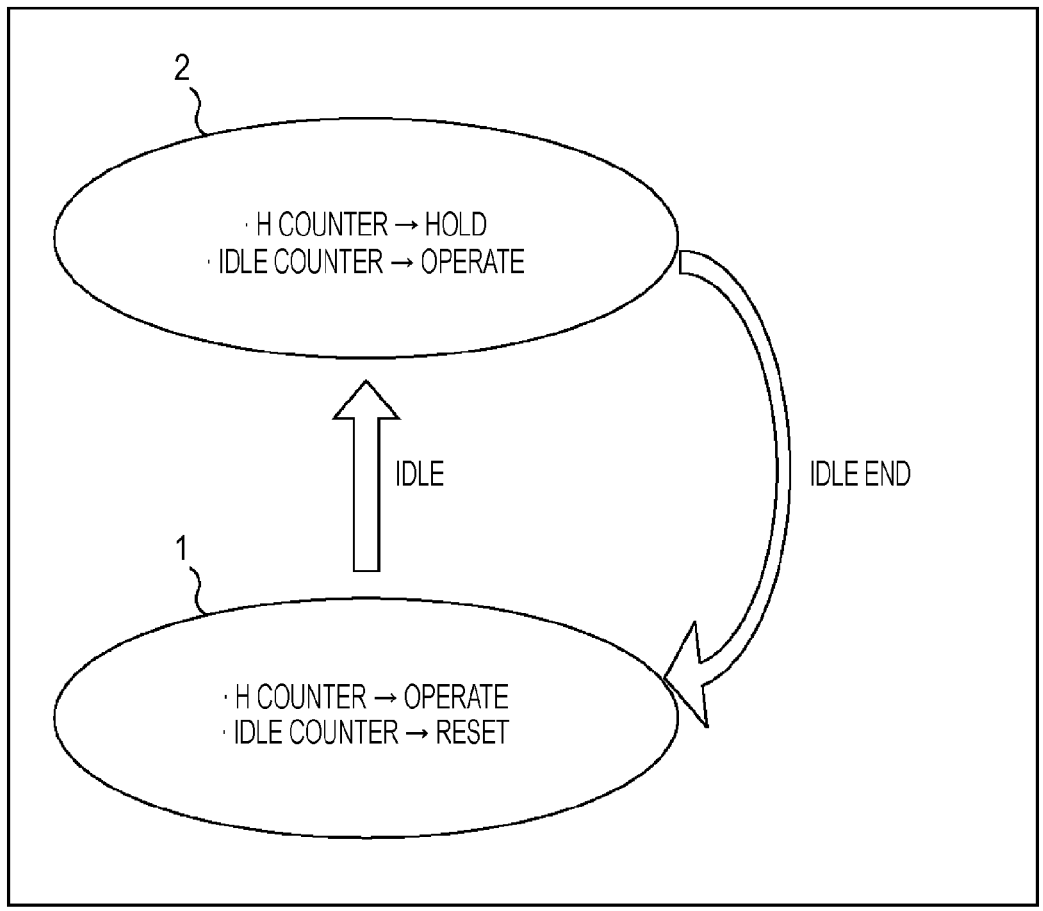
FIG. 4 is a status transition diagram of a status.
FIG. 5 is an illustration showing an example of data in a register relating to status transition.

In addition, as shown in FIG. 4, provided that a status in which the H counter 104 operates (performs counting) but the idle counter 106 does not operate (maintained in a reset state) is defined as status 1 and a status in which the H counter 104 is in a hold state (stopped) but the idle counter 106 operates is defined as status 2, the decoder 102 performs switching between status 1 and status 2 in an appropriate manner in accordance with whether the mode of the resolution of AD conversion is the 9-bit mode, the 10-bit mode, or the 12-bit mode. Note that a determination of whether the mode of the resolution of AD conversion is the 9-bit mode, the 10-bit mode, or the 12-bit mode can be identified in accordance with a control signal from the outside.

Specifically, in the case where the mode of the resolution of AD conversion is the 9-bit mode, the decoder 102 maintains only status 1 and does not allow transition to status 2. Meanwhile, in the case where the mode of the resolution of AD conversion is the 10-bit mode or the 12-bit mode, at a time when the count value of the H counter 104 reaches a specific count value, the decoder 102 shifts the status from status 1 to status 2.

The count values of the H counter 104 at which the status is to be shifted to status 2 are stored in the register 101, as shown in FIG. 5.

FIG. 5 shows an example of data in the register 101 relating to the status transition.

As described above, the count value of the H counter 104 at which the status is to be shifted to status 2, that is, the count value of the H counter 104 at which the H counter 104 is to be stopped and the idle counter 106 is to be operated (hereinafter, also referred to as an idle start count value, where necessary), and the number of counts to be counted by the idle counter 106 in order to cause the status to return to status 1, that is, the number of counts to be counted in order to resume the H counter 104 in the case where the mode of the resolution of AD conversion is the 10-bit mode or the 12-bit mode, are stored for each of the 10-bit mode and the 12-bit mode.

The data example of FIG. 5 shows that the H counter 104 is stopped when the H count value reaches 756 and 1556 and the H counter 104 is resumed when the idle counter 106 counts to 512 in the case where the mode of the resolution of AD conversion is the 10-bit mode and that the H counter 104 is stopped when the H count value reaches 756 and 1556 and the H counter 104 is resumed when the idle counter 106 counts to 3584 in the case where the mode of the resolution of AD conversion is the 12-bit mode.

Although the details will be described later with reference to FIG. 7, the H count value 756 is within the P-phase period during which the A/D conversion unit 46 performs down-counting and the H count value 1556 is within the D-phase period during which the A/D conversion unit 46 performs up-counting.

Note that although the idle start count values for the 10-bit mode and the 12-bit mode are the same in the example of FIG. 5, these count values are not necessarily the same. In addition, in the case where the idle start count values for the 10-bit mode and the 12-bit mode are the same as in FIG. 5, a piece of data can be referred to in common.

Referring back to FIG. 3, in a case where the status is status 1, that is, in a case where the H counter 104 is operated, the decoder 102 supplies, to the AND circuit 103, a hold-off signal for not causing the H counter 104 to enter a hold state, and supplies, to the idle counter 106, a hold-on signal for causing the idle counter 106 to enter a hold state.

Meanwhile, in a case where the status is status 2, the decoder 102 supplies, to the AND circuit 103, a hold-on signal for causing the H counter 104 to enter the hold state, and supplies, to the idle counter 106, a hold-off signal for causing the idle counter 106 to operate. The count values of the H counter 104 and the idle counter 106 are supplied to the decoder 102.

An H clock signal generated in the logic control circuit 31 is input to the AND circuit 103, and a hold-on signal or a hold-off signal from the decoder 102 is input to the AND circuit 103. In a case where a hold-off signal is supplied from the decoder 102, the AND circuit 103 supplies the received H clock signal directly to the H counter 104. Meanwhile, in a case where a hold-on signal is supplied from the decoder 102, the AND circuit 103 does not supply the H clock signal to the H counter 104.

The H counter 104 (a first counter) performs counting in accordance with an H clock supplied from the AND circuit 103. When the status is status 2, since the H clock is not supplied from the AND circuit 103, the H counter 104 enters an idle state and the count value is maintained.

As with the AND circuit 103, the AND circuit 105 supplies the received H clock signal directly to the idle counter 106 in a case where a hold-off signal is supplied from the decoder 102, and does not supply the H clock signal to the idle counter 106 in a case where a hold-on signal is supplied from the decoder 102.

The idle counter 106 (a second counter) performs counting in accordance with an H clock supplied from the AND circuit 105. At a time when supply of an H clock is once completed, the idle counter 106 is reset. Thus, when an H clock is next supplied from the AND circuit 105, counting starts from 1.

Figure 6:
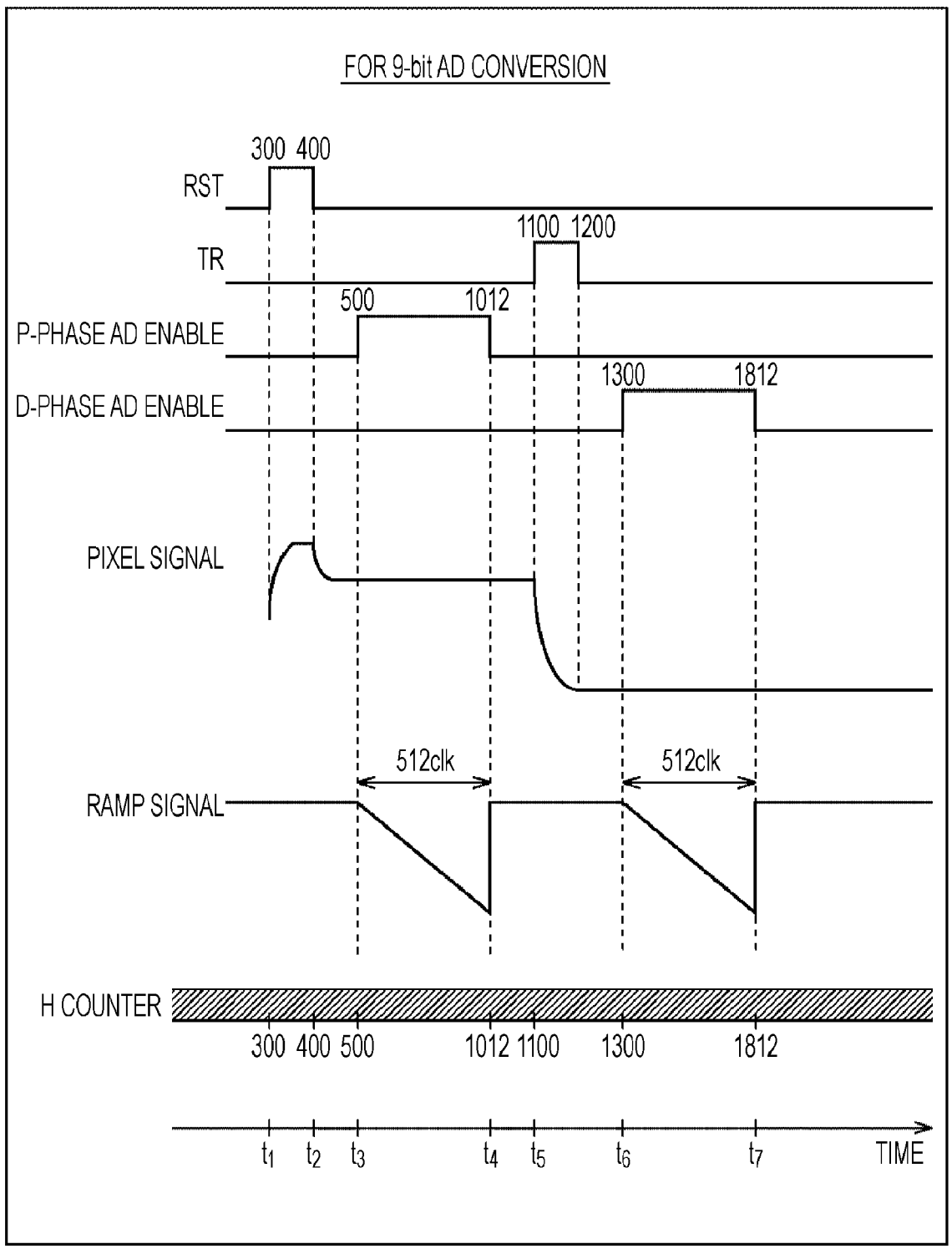
FIG. 6 is an illustration for explaining an operation in a 9-bit mode.

Next, an operation in the 9-bit mode will be explained will be described with reference to FIG. 6.

As described above, in a case where the mode of the resolution of AD conversion is the 9-bit mode, the status is only status 1 and is not shifted to status 2. In FIG. 6, a period during which counting is performed is represented by oblique lines (the same is applied to FIG. 7 described later), and the H counter 104 performs counting for the entire period without stopping.

Various pulses, such as a reset pulse (RST) and a transfer pulse (TR), are controlled to be output at times when specific count values stored in the register 101 are obtained. For example, the reset pulse (RST) is output in such a manner that the reset pulse rises at time $t_1$ when the H count value of the H counter 104 reaches 300 and falls at time $t_2$ when the H count value reaches 400. The transfer pulse (TR) is output in such a manner that the transfer pulse rises at time $t_5$ when the H count value of the H counter 104 reaches 1100 and falls at time $t_7$ when the H count value reaches 1200. A P-phase AD enable pulse is output in such a manner that the P-phase AD enable pulse rises at time $t_3$ when the H count value of the H counter 104 reaches 500 and falls at time $t_4$ when the H count value reaches 1012. A D-phase AD enable pulse is output in such a manner that the D-phase AD enable pulse rises at time $t_6$ when the H count value of the H counter 104 reaches 1300 and falls at time $t_7$ when the H count value reaches 1812. Note that the H count values for rising and falling of these pulses described above are merely examples and H count values for rising and falling of these pulses are not limited to the values shown in FIG. 6.

When the reset pulse is Hi (High), a reset signal for turning on the reset transistor is supplied to the pixel 41, and the voltage of a pixel signal in the vertical signal line 43 is increased to a reset level. Then, during a P-phase AD enable period in which a P-phase AD enable pulse is Hi, the comparator 48 compares the pixel signal corresponding to a reset component ΔV with a ramp signal, and the A/D converter 49 counts, as the reset component ΔV, until the voltages of the pixel signal and the ramp signal reach the same level.

In addition, after the transfer transistor in the pixel 41 is turned on, during a D-phase AD enable period in which a D-phase AD enable pulse is Hi, the comparator 48 compares the pixel signal corresponding to (signal component Vsig+reset component ΔV) with the ramp signal, and the A/D converter 49 counts, as (signal component Vsig+reset component ΔV), until the voltages of the pixel signal and the ramp signal reach the same level.

Down-counting is performed during the P-phase AD enable period and up-counting is performed during the D-phase AD enable period. Thus, by combining the P-phase AD enable period and the D-phase AD enable period, only the signal component Vsig can be output in accordance with (signal component Vsig+reset component ΔV)−(reset component ΔV). Accordingly, a CDS process is realized.

Each of the P-phase AD enable period and the D-phase AD enable period corresponds to a comparison time period during which a pixel signal and a ramp signal (reference voltage) are compared with each other. In the 9-bit mode, in accordance with 9 bits, each of the periods is a period for 512 clocks.

Next, an operation in the 10-bit mode will be explained with reference to FIG. 7.

According to the data in the register 101 explained with reference to FIG. 5, in the 10-bit mode, the H counter 104 is stopped when the H count value reaches 756 and 1556, and the H counter 104 is resumed when the idle counter 106 counts to 512.

Thus, the decoder 102 shifts the status from status 1 to status 2 at time $t_{15}$ when the count value of the H counter 104 reaches 756. That is, at time $t_{15}$, the decoder 102 stops the H counter 104 and starts counting by the idle counter 106. Then, at time $t_{16}$ when the count value of the idle counter 106 reaches 512, which is the number of counts for the 10-bit mode stored in the register 101, the decoder 102 shifts the status from status 2 to status 1. That is, the decoder 102 resumes the H counter 104.

Similarly, at time $t_{22}$ when the count value of the H counter 104 reaches 1556, the decoder 102 shifts the status from status 1 to status 2. That is, at time $t_{22}$, the decoder 102 stops the H counter 104 and starts counting by the idle counter 106. Then, at time $t_{23}$ when the count value of the idle counter 106 reaches 512, the decoder 102 shifts the status from status 2 to status 1. That is, the decoder 102 resumes the H counter 104.

In status 2 in which the idle counter 106 performs counting, the count value of the H counter 104 does not change. Thus, all the reset pulse, the transfer pulse, the P-phase AD enable pulse, and the D-phase AD enable pulse maintain the conditions in status 1 that are immediately before the transition to status 2.

Each of the P-phase AD enable period and the D-phase AD enable period is obtained by insertion (expansion) of a period for 512 clocks, which corresponds to the number of counts of the idle counter 106. Thus, each of the P-phase AD enable period and the D-phase AD enable period corresponds to a period for 1024 clocks, which correspond to the 10-bit mode. Hence, 10-bit AD conversion can be performed. Note that here, registers for specifying rising and falling of the reset pulse, the transfer pulse, the P-phase AD enable pulse, and the D-phase AD enable pulse are not necessarily changed, and the interval between the P-phase period and the D-phase period is the same as that in the 9-bit mode.

Figure 8:
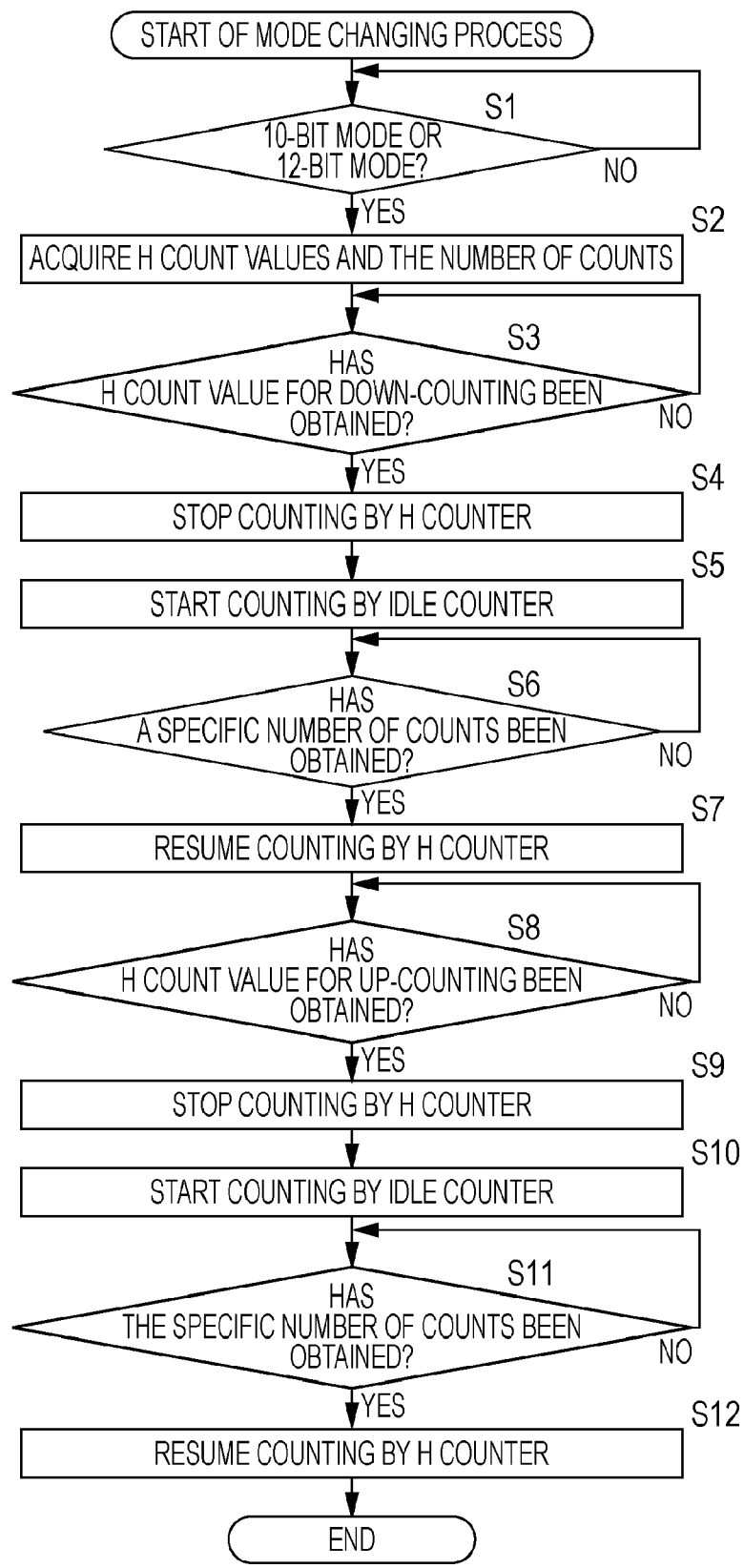
FIG. 8 is a flowchart for explaining a mode changing process.

Next, a mode changing process by the logic control circuit 31 will be explained with reference to FIG. 8. FIG. 8 is a flowchart of the mode changing process.

First, in step S1, the decoder 102 determines whether the current mode is the 10-bit mode or the 12-bit mode. In step S1, the processing operation is repeatedly performed until the current mode is determined to be the 10-bit mode or the 12-bit mode. In a case where it is determined that the current mode is the 10-bit mode or the 12-bit mode, the process proceeds to step S2.

In step S2, the decoder 102 acquires, from the register 101, the H count values (idle start count values) and the number of counts corresponding to the current mode.

In step S3, the decoder 102 monitors the H counter 104 and determines whether or not the H count value has reached the H count value (idle start count value) for down-counting acquired from the register 101. In step S3, the decoder 102 waits (monitoring is continued) until the H count value of the H counter 104 reaches the H count value for down-counting.

In a case where it is determined in step S3 that the H count value of the H counter 104 has reached the H count value for down-counting, the decoder 102 shifts the status to status 2 in steps S4 and S5. That is, in step S4, by supplying, to the AND circuit 103, a hold-on signal for causing the H counter 104 to enter a hold state, the decoder 102 stops counting by the H counter 104. In step S5, by supplying, to the idle counter 106, a hold-off signal for causing the idle counter 106 to operate, the decoder 102 starts counting by the idle counter 106.

In step S6, the decoder 102 determines whether or not the count value of the idle counter 106 has reached a specific number of counts, that is, whether or not the count value of the idle counter 106 has reached the number of counts acquired from the register 101. The processing operation of step S6 is repeatedly performed until it is determined that the count value of the idle counter 106 has reached the specific number of counts.

In a case where it is determined in step S6 that the count value of the idle counter 106 has reached the specific number of counts, the process proceeds to step S7, in which the decoder 102 shifts the status to status 1. That is, by supplying, to the AND circuit 103, a hold-off signal for not causing the H counter 104 to enter the hold state, the decoder 102 resumes counting by the H counter 104. In addition, by supplying, to the idle counter 106, a hold-on signal for causing the idle counter 106 to enter the hold state, the decoder 102 resets and stops counting by the idle counter 106.

In step S8, the decoder 102 monitors the H counter 104, and determines whether or not the H count value has reached the acquired H count value (idle start count value) for up-counting. In step S8, the decoder 102 waits (monitoring is continued) until the H count value of the H counter 104 has reached the H count value for up-counting acquired from the register 101.

In a case where it is determined in step S8 that the H count value of the H counter 104 has reached the H count value for up-counting, the decoder 102 shifts the status to status 2 in steps S9 and S10. The processing operations are similar to the processing operations of step S4 and S5.

In step S11, the decoder 102 determines whether or not the count value of the idle counter 106 has reached the specific number of counts, that is, whether or not the count value of the idle counter 106 has reached the number of counts acquired from the register 101. The processing operation of step S11 is repeatedly performed until it is determined that the count value of the idle counter 106 has reached the specific number of counts.

Then, in a case where it is determined in step S11 that the count value of the idle counter 106 has reached the specific number of counts, the decoder 102 shifts the status to status 1 in step S12, as in step S7. Then, the process ends.

Figure 9:
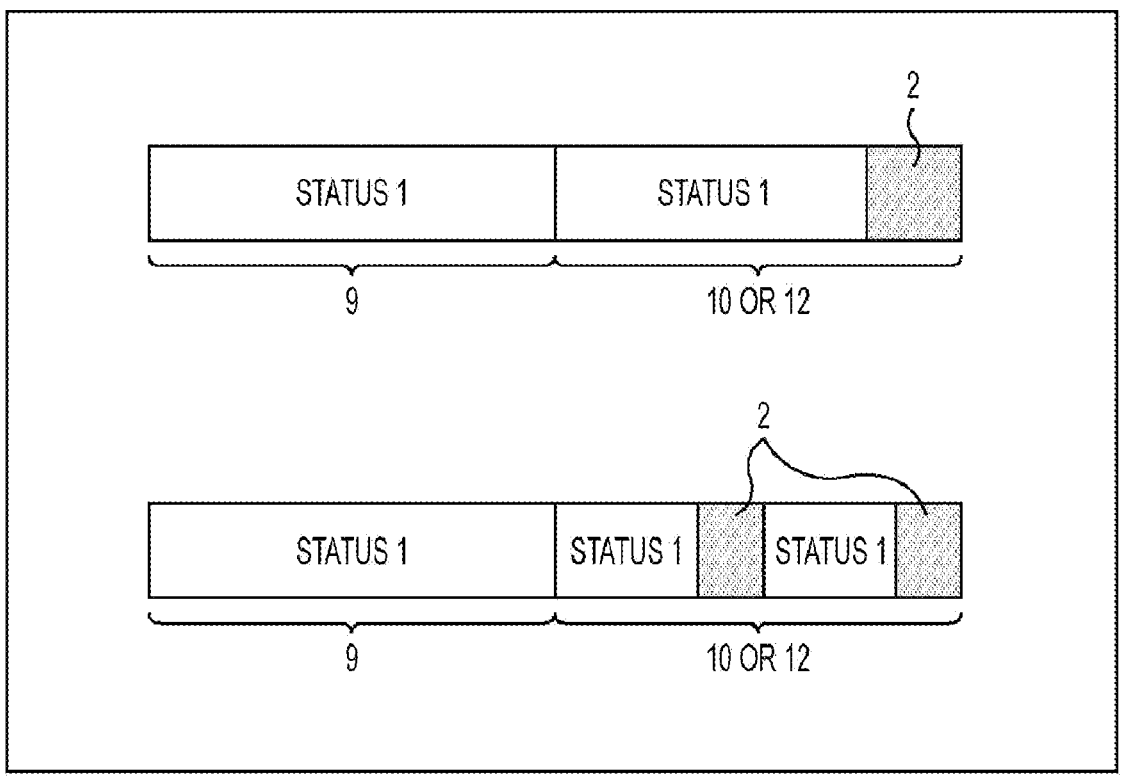
FIG. 9 is an illustration showing a concept of mode changing.

FIG. 9 is an illustration showing a concept of mode changing in this embodiment.

In a case where only the condition of status 1 is maintained and transition to status 2 does not occur during the P-phase AD enable period or the D-phase AD enable period, the image sensor 30 is operating in the 9-bit mode. Meanwhile, in a case where the status is shifted to status 2 at specific timings in the P-phase AD enable period and the D-phase AD enable period and idle periods during which the H counter 104 is in an idle state are inserted, the 10-bit mode or the 12-bit mode can be realized.

Consequently, according to the mode changing process by the logic control circuit 31, since an interval period is not necessary for mode changing, there is an advantage in that high-speed performance is not degraded.

Figure 7:
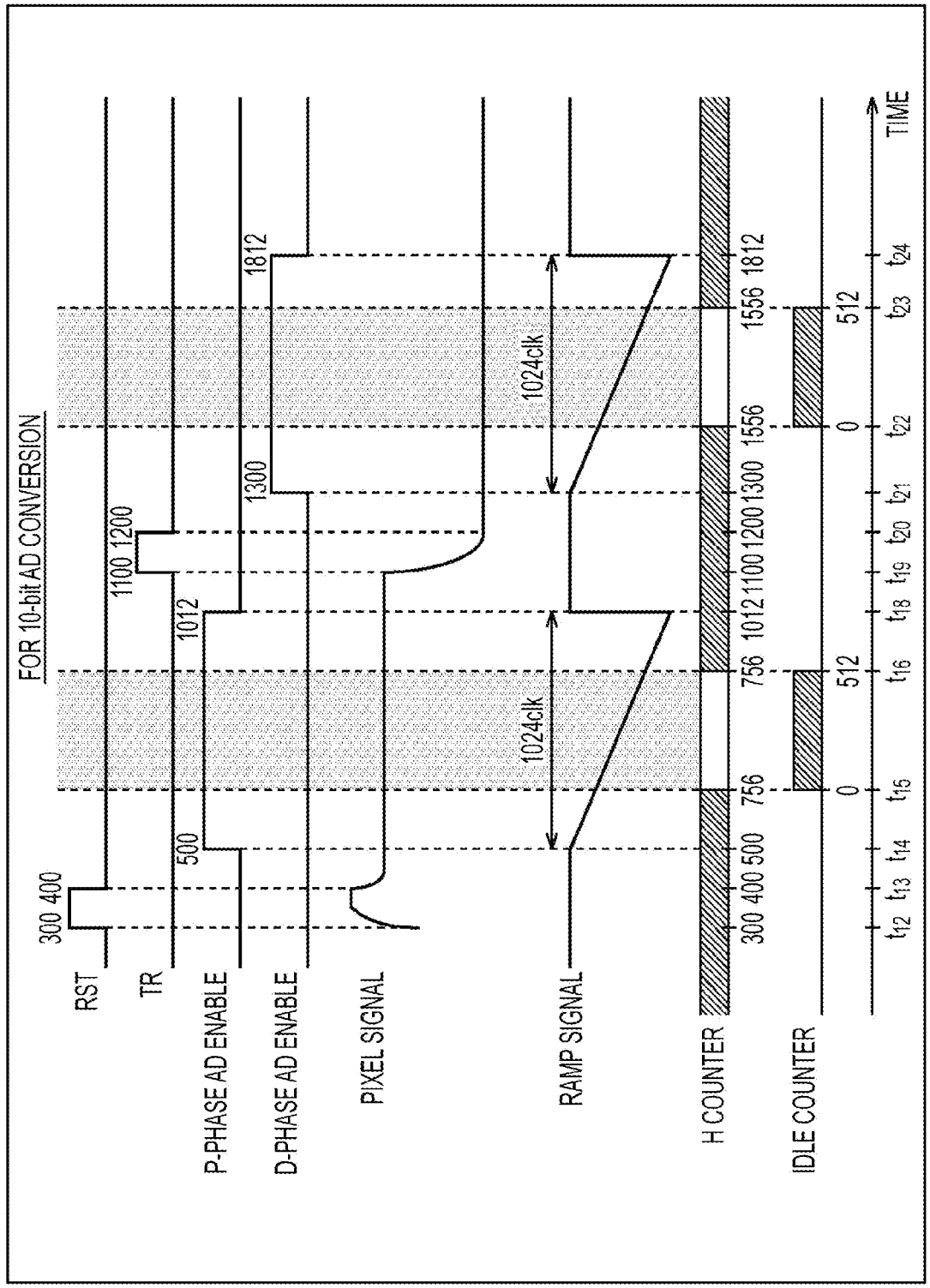
FIG. 7 is an illustration for explaining an operation in a 10-bit mode.

In addition, although an example in which the status is shifted to status 2 at the midpoint times (H counter values) of the P-phase AD enable period and the D-phase AD enable period has been explained as the example shown in FIG. 7, the status may be shifted to status 2 at any timing within the P-phase AD enable period and the D-phase AD enable period. That is, it is only necessary that the period of status 2 be correspond to, as a whole, 512 clocks in the 10-bit mode and 3584 clocks in the 12-bit mode.

FIG. 9 shows an example in which the period of status 2 is inserted at the ending of the P-phase AD enable period or the D-phase AD enable period and an example in which the period of status 2 is inserted in such a manner that the period is divided into a plurality of sections. Hence, according to the mode changing process by the logic control circuit 31, the period of status 2 can be freely set in accordance with values stored in the register 101 and settling of pulses and the like can be controlled.

As described above, according to the logic control circuit 31 of the image sensor 30 in FIG. 2, since the idle counter 106 is provided and idle start count values and the number of counts are stored in the register 101, only a P-phase AD enable pulse and a D-phase AD enable pulse that need to be changed in accordance with a change in the bit mode can be changed. That is, in the case of changing the resolution of AD conversion, changing of only a pulse that needs to be changed can be performed with a more simplified configuration. In addition, since the interval between a P-phase AD enable period and a D-phase AD enable period is not increased, the bandwidth of an HPF is not needlessly widened in each mode. In other words, the bandwidth of noise passing through the HPF after AD conversion is reduced, and the deterioration in the S/N can be avoided.

In addition, in the case where registers are uniformly changed as in conventional method 1), registers for all the pulses need to be rewritten when the mode is changed. However, in this mode changing process, even though it is necessary to store data relating to status transition shown in FIG. 5, the number of registers and the number of gates are not significantly increased, compared with conventional method 2). Hence, the circuit area of the SCU can also be reduced.

FIG. 10 is a block diagram showing an example of the configuration of a digital camera (image pickup apparatus) 150 employing the image sensor in FIG. 2. Note that the digital camera 150 may be a digital still camera or a digital video camera.

The digital camera 150 is constituted by a lens 151 including a zoom optical system, an image sensor unit 152 employing the image sensor 30 in FIG. 1, a signal processing unit 153, a display unit 154, a codec processing unit 155, a medium recording unit 156, a controller 157, a main CLK generation unit 158, and an operation input unit 159.

The image sensor unit 152 is an image sensor that is capable of outputting pixel data at three types of AD conversion resolution, 9 bits, 10 bits, and 12 bits, by performing the mode changing process described above. The image sensor unit 152 supplies, to the signal processing unit 153, an image pickup signal (a signal corresponding to pixel data) corresponding to the set AD conversion resolution.

The signal processing unit 153 performs specific signal processing, such as white balance processing, gamma correction processing, and color separation processing, on the supplied image pickup signal, and supplies the processed image pickup signal to the display unit 154 and the codec processing unit 155. Note that the signal processing unit 153 is capable of performing signal processing individually for the display unit 154 and the codec processing unit 155.

The display unit 154 is constituted by, for example, an LCD (Liquid Crystal Display) or the like. The display unit 154 displays the image pickup signal from the signal processing unit 153 as an image. The codec processing unit 155 compresses the image pickup signal from the signal processing unit 153 in accordance with a specific compression method, and supplies the compressed image pickup signal to the medium recording unit 156. The medium recording unit 156 stores the image pickup signal from the signal processing unit 153 into a recording medium, such as, for example, a semiconductor memory, a magnetic disk, a magneto-optical disk, or an optical disk, under the control of the controller 157. The recording medium may be configured so as to be detachable from the digital camera 150.

The controller 157 controls the image sensor unit 152, the signal processing unit 153, the display unit 154, the codec processing unit 155, the medium recording unit 156, and the main CLK generation unit 158, in accordance with a user operation input entered by using the operation input unit 159. For example, the controller 157 supplies, to the image sensor unit 152, a control signal for performing switching between the 10-bit mode and the 12-bit mode in accordance with an operation signal representing a moving image mode or a static image mode supplied from the operation input unit 159.

The main CLK generation unit 158 generates a main CLK, and supplies the main CLK to the image sensor unit 152. The operation input unit 159 is constituted by, for example, a jog dial, a key, a lever, a button, and a touch panel, as well as a shutter button for issuing an instruction to capture an image. The main CLK generation unit 158 supplies, to the controller 157, an operation signal corresponding to an operation by a user.

In this description, the steps described in the flowchart include not only processing performed in time series in accordance with the written order but also processing performed in parallel or independently, the processing being not necessarily performed in time series.

In addition, although a P-phase AD enable pulse and a D-phase AD enable pulse are extended in this embodiment, similar control can be applied to a case where other pulses are desired to be extended.

Embodiments of the present invention are not limited to the embodiments described above. Various changes can be made to the present invention without departing from the gist of the present invention.

The invention claimed is:

1. A solid-state image pickup device which can be switched between a plurality of AD conversion resolutions by changing a comparison time period during which a pixel signal output from a pixel and a reference voltage are compared with each other, comprising:
   a first counter configured to count at least a comparison time period of a first resolution and a comparison time period of a second resolution;
   a second counter configured to count at least a time period between the comparison time period of the first resolution and the comparison time period of the second resolution;
   storage means for storing (a) a number of counts representing a difference between the comparison time period for the first resolution that is the lowest resolution among the plurality of AD conversion resolutions and the comparison time period for the second resolution that is different from the first resolution, and (b) a start count value that is a count value of the first counter at which counting to the number of counts is started; and
   a counter control section to (a) stop counting by the first counter and start counting by the second counter when a set AD conversion resolution is the second resolution and the count value of the first counter reaches the start count value and (b) resume counting by the first counter when the count value of the second counter reaches the number of counts.

2. A driving control method for a solid-state image pickup device including a first counter configured to count a comparison time period of a first resolution and a comparison time period of a second resolution, the comparison time period being a time during which a pixel signal output from a pixel and a reference voltage are compared with each other, a second counter configured to count a time period between the comparison time period of the first resolution and the comparison time period of the second resolution, and storage means for storing (a) a number of counts representing a difference between the comparison time period for the first resolution that is the lowest resolution among a plurality of AD conversion resolutions and the comparison time period for the second resolution that is different from the first resolution, and (b) a start count value that is a count value of the first counter at which counting to the number of counts is started, the solid-state image pickup device performing switching between the plurality of AD conversion resolutions by changing the comparison time period, the driving control method comprising:
   stopping counting by the first counter and starting counting by the second counter when a set AD conversion resolution is the second resolution and the count value of the first counter reaches the start count value; and
   resuming counting by the first counter when the count value of the second counter reaches the number of counts.

3. An image pickup apparatus for capturing an image by using a solid-state image pickup device which can be switched between a plurality of AD conversion resolutions by changing a comparison time period during which a pixel signal output from a pixel and a reference voltage are compared with each other,
   wherein the solid-state image pickup device includes
      a first counter configured to count at least a comparison time period of a first resolution and a comparison time period of a second resolution,
      a second counter configured to count a time period between the comparison time period of the first resolution and the comparison time period of the second resolution,
      storage means for storing (a) a number of counts representing a difference between the comparison time period for the first resolution that is the lowest resolution among the plurality of AD conversion resolutions and the comparison time period for the second resolution that is different from the first resolution, and (b) a start count value that is a count value of the first counter at which counting to the number of counts is started, and
      a counter control section to (a) stop counting by the first counter and start counting by the second counter when a set AD conversion resolution is the second resolution and the count value of the first counter reaches the start count value and (b) resume counting by the first counter when the count value of the second counter reaches the number of counts.

* * * * *